United States Patent [19]
Curd et al.

[11] Patent Number: 5,949,987
[45] Date of Patent: Sep. 7, 1999

[54] EFFICIENT IN-SYSTEM PROGRAMMING STRUCTURE AND METHOD FOR NON-VOLATILE PROGRAMMABLE LOGIC DEVICES

[75] Inventors: Derek R. Curd, Fremont; Kameswara K. Rao, San Jose; Napoleon W. Lee, Milpitas, all of Calif.

[73] Assignee: Xilinx, Inc., San Jose, Calif.

[21] Appl. No.: 09/048,923

[22] Filed: Mar. 26, 1998

Related U.S. Application Data

[63] Continuation-in-part of application No. 08/512,796, Aug. 9, 1995, Pat. No. 5,734,868.

[51] Int. Cl.$^6$ .................................................. G05B 19/045
[52] U.S. Cl. .......................... 395/500.17; 712/37; 326/38
[58] Field of Search ............................. 395/500.17, 500; 712/37; 326/38, 39

[56] References Cited

U.S. PATENT DOCUMENTS

| | | | |
|---|---|---|---|
| 4,761,768 | 8/1988 | Turner et al. | 365/201 |
| 4,855,954 | 8/1989 | Turner et al. | 365/185 |
| 4,879,688 | 11/1989 | Turner et al. | 365/201 |
| 5,237,218 | 8/1993 | Josephson et al. | 307/465 |
| 5,329,179 | 7/1994 | Tang et al. | 307/465 |
| 5,336,951 | 8/1994 | Josephson et al. | 307/465 |
| 5,412,260 | 5/1995 | Tsui et al. | 326/39 |
| 5,566,344 | 10/1996 | Hall et al. | 395/800.37 |
| 5,581,779 | 12/1996 | Hall et al. | 395/800 |
| 5,635,855 | 6/1997 | Tang | 326/8 |
| 5,734,868 | 3/1998 | Curd et al. | 395/500.17 |

FOREIGN PATENT DOCUMENTS 920225768  8/1992  Japan .

OTHER PUBLICATIONS

Reference Book "IEEE Standard Test Access Port and Boundary–Scan Architecture", IEEE Std 1149.1, Oct. 21, 1993, Published by the Institute of Electrical and Electronics Engineers, Inc. 345 East 47th Street, NY, NY 10017, pp. 3–1 through 5–16 and 7–1 through 7–28.

*Primary Examiner*—Kevin J. Teska
*Assistant Examiner*—Russell W. Frejd
*Attorney, Agent, or Firm*—Jeanette S. Harms

[57] ABSTRACT

An in-system programming/erasing/verifying structure for non-volatile programmable logic devices includes a data input pin, a data output pin, an instruction register, a plurality of data registers including an ISP register, wherein said instruction register and said plurality of data registers are coupled in parallel between said data input pin and said data output pin, and a controller for synchronizing said instruction register and said plurality of data registers. The ISP register includes: an address field, a data field, and a status field. An ISP instruction need only be entered once to program/erase the entire device. Specifically, the address/data packets can be shifted back to back into the ISP register without inserting multiple instructions between each packet at the data input pin, thereby dramatically decreasing the time required to program/erase the entire device in comparison to known ISP methods. Furthermore, the invention provides an efficient method for providing the status (i.e. result), of the ISP operations to either the end-user or the supporting software.

5 Claims, 7 Drawing Sheets

| ST[1:0] | FUNCTION |
|---|---|
| 00 | Output: Operation Not Completed |
| 01 | Output: Operation Done - Failed |
| 10 | Input: Valid Address / PDATA     Output: Operation Not Allowed |
| 11 | Output: Operation Done - Passed |

EFFICIENT IN-SYSTEM PROGRAMMING STRUCTURE AND METHOD FOR NON-VOLATILE PROGRAMMABLE LOGIC DEVICES

RELATED APPLICATIONS

This application is a continuation-in-part application of U.S. patent application Ser. No. 08/512,796, entitled "Efficient In-System Programming Structure and Method for Non-Volatile Programmable Logic Devices", filed on Aug. 9, 1995, now U.S. Pat. No. 5,734,868.

BACKGROUND OF THE INVENTION

1. Field of the Invention

The present invention relates to programmable logic devices and in particular to an in-system programming scheme for those devices.

2. Description of the Related Art

Programmable logic devices (PLDS) typically make use of one or more non-volatile memory cell (e.g. EPROM, EEPROM, Flash EPROM, or Flash EEPROM) arrays which programmably create data paths and logic functions within the device that are specific to the user's design. Typically, these arrays are erasable, thereby allowing the desired functionality of the PLD to be re-programmed many times.

Various types of program, erase, and verify operations allow the user to program and re-program the PLD. For PLDs that are programmed out-of-system in a programming socket, much of the burden for programming, erasing and verifying the contents of the memory arrays is placed on the software controlling the programmer. Additionally, out-of-system programmers typically have parallel access to the address and data pins of the chip, thereby allowing the programming software to cycle quickly through the necessary address and data packets needed to program the device, which contributes to the efficiency of the programming operation.

However, the industry is increasingly using PLDs that can be programmed and erased in-system, that is, while these devices are soldered into place on the circuit board in which the devices will be used. Because the programming software is much more restricted in its access to the in-system PLD, more of the burden for the program, erase, and verify procedures is placed on the chip itself.

As is well known to those in the art, the term In-System Programming (hereinafter ISP) refers to the entire process of programming a device in-system, and, therefore, encompasses the actions of erasing and verifying the design in the device in addition to the specific action of memory cell programming. For ISP processes, the programming software is conventionally limited to serial access to the device through a small number of dedicated pins (typically 4 or 5). This configuration immediately makes the program, erase, and verify operations less efficient because communication with the chip is limited to a single serial port through which all address and data information, as well as the necessary ISP instructions, must enter the device.

Additionally, the high-voltage power supply bus for programming of the device is not available. Thus, internal charge-pumps are required on-chip to generate the necessary voltage levels from conventional internal standard Vcc levels (4.5–5.5V). However, the on-chip charge-pumps cannot provide the quick, strong drive of an external supply. Therefore, programming and erasing operations for ISP devices can be significantly less efficient than operations for out-of-system devices.

Typically, an ISP device contains a number of different instruction and data shift registers which are accessed through the same serial port. These registers are used to hold the instruction code or the address and data values which might ordinarily be driven at the pins of the device in a parallel, out-of-system programming process. In this ISP process, the controlling software includes ISP instructions which control access to the data registers and determine which ISP operation is currently active.

In programming data to the location(s) addressed by a single address, a typical ISP algorithm may require that a LOAD instruction be entered serially into the ISP device, followed by the serial entry of an address/data packet. Then, the LOAD instruction is terminated and the actual PROGRAM instruction is shifted into the registers, thereby initiating the programming cycle for the current address/data. After the programming cycle, an additional VERIFY instruction may be required to verify that the intended data was successfully programmed at the given address.

Because there is only one serial port available for entering ISP instructions as well as address/data packets, a typical ISP device requires multiple switches between instructions and data for each address during programming, thereby decreasing the device's efficiency. Therefore, a need arises for a method of performing efficient in-system programming, erasing, and design verification of PLDS.

SUMMARY OF THE INVENTION

According to the present invention, an in-system programming/erasing/verifying structure for non-volatile programmable logic devices includes a data input pin, a data output pin, an instruction register, a plurality of data registers including an ISP register, wherein said instruction register and said plurality of data registers are coupled in parallel between said data input pin and said data output pin, and a controller for synchronizing said instruction register and said plurality of data registers. The ISP register includes: an address field, a data field, and an n-bit status field. In one embodiment, the status field stores a two-bit code. In other embodiments, more or less bits are provided in the status field.

An ISP programming method in accordance with the present invention includes shifting a programming instruction into an instruction register, thereby selecting the ISP register as the active data register. Then, an address, data, and a first status code are shifted into the ISP register. The first status code allows initiation of a programming pulse for the data at that address. After the programming pulse is terminated, a verify operation is automatically performed on the data at the current address. The verify operation determines whether a selected memory cell (or set of memory cells) was properly programmed. In one embodiment, the verify operation compares the states stored by the selected memory cells to the data shifted into the ISP register. Depending on whether the states match the data values, another predetermined status code is loaded into the ISP register.

An ISP erasing method in accordance with the present invention includes shifting an erase instruction into the instruction register, thereby once again selecting the ISP register as the active data register. To perform an erase operation, the address of the sector to be erased is shifted into the ISP register with the first status code (the data code being a "don't care" or the data field being bypassed). The first status code allows the initiation of the erase pulse for the address of the sector indicated in the address field. After the erase pulse is terminated, the device automatically performs a self-blank check operation on the current sector to verify that it was properly erased. Depending on the success of the blank check, the status field of the ISP register is loaded with another predetermined code.

An ISP verifying method in accordance with the present invention includes shifting a verify instruction into the instruction register, thereby once again selecting the ISP register as the active data register. To perform the verify operation, the desired address is shifted into the ISP register with the first status code (data being a "don't care"). The first status code allows initiation of a verify pulse of a specified length. When the verify pulse is terminated, the states of the memory cells at the addressed location are loaded into the data field of the ISP register. These states may then be shifted out through the data output pin for inspection.

In accordance with the present invention, an ISP architecture and instruction set advantageously allows a single ISP instruction to perform a number of different operations on each address/data packet, thereby significantly reducing the inefficiency of known ISP program, erase, and verify routines for a PLD. For example, the appropriate ISP instruction need only be entered once to program/erase the entire device. In this manner, the address/data packets can be shifted back to back into the ISP register without inserting multiple instructions between each packet at the data input pin, thereby dramatically decreasing the time required to program/erase the entire device in comparison to known ISP methods. Furthermore, the invention provides an efficient method for providing the status (i.e. result), of the ISP operations to either the end-user or the supporting software. As yet a further advantage, the present invention facilitates multi-chip programming/erasing by connecting the data output pin of one device to the data input pin of another device.

DETAILED DESCRIPTION OF THE DRAWINGS

Figure 1:
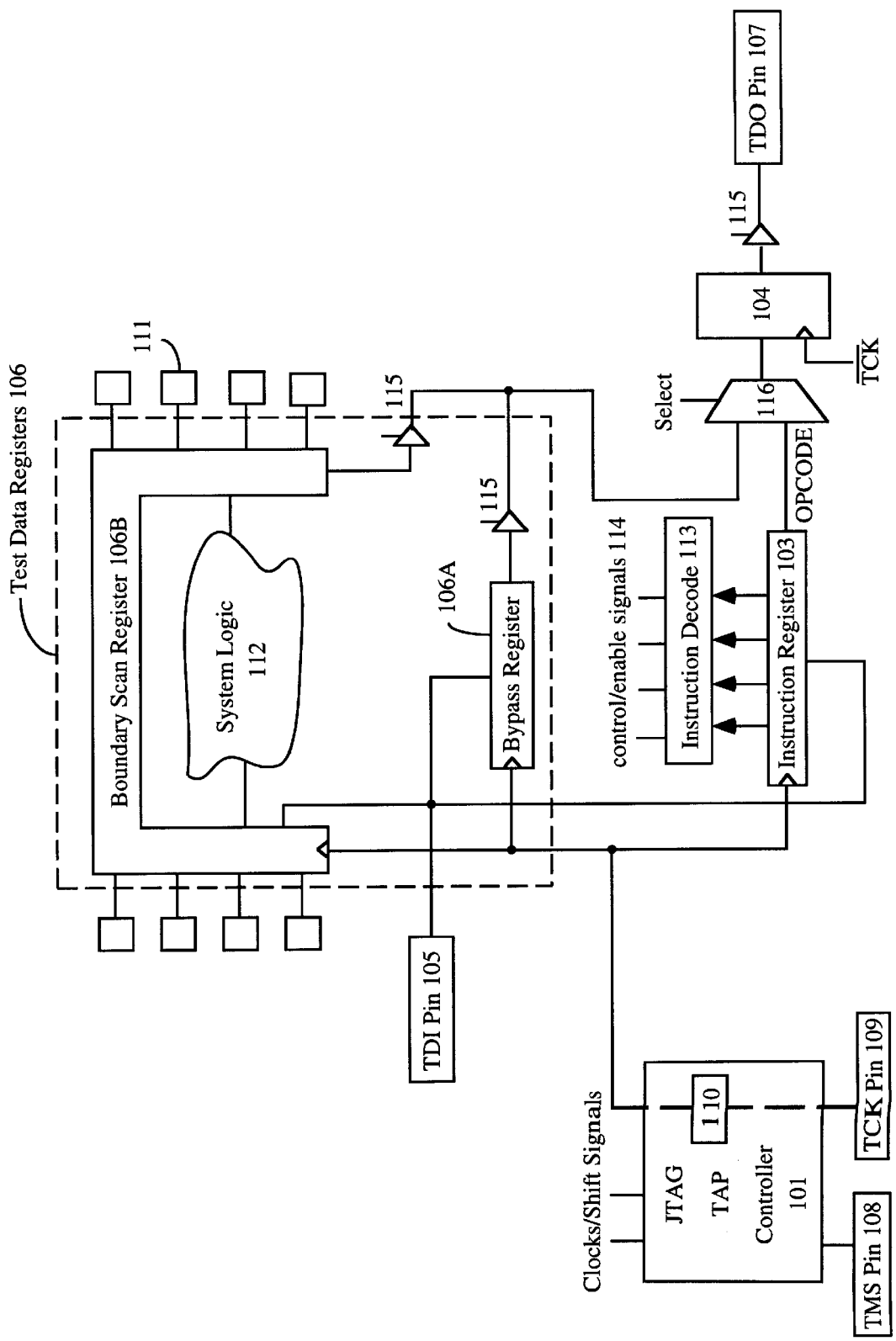
FIG. 1 illustrates a conventional JTAG architecture.

The ISP architecture and instruction set of the present invention is compatible with the Joint Test Action Group (JTAG) standard described in IEEE Std. 1149.1, sections 3, 4, 5 and 7, which are incorporated by reference herein. Referring to FIG. 1, the mandatory JTAG architecture for a component adhering to IEEE Std. 1149.1 includes a single instruction register 103, a set of data registers 106 (including a bypass register 106A and a boundary scan register 106B), and a TAP controller 101 (a 16-state finite state machine). A TDI pin 105, the serial input terminal to the device, provides signals to instruction register 103, bypass register 106A, and boundary scan register 106B. A TDO pin 107, the serial output terminal of the device, is driven by active register 104, which is triggered by the negative edge of clock signal TCK. A TMS pin 108 provides signals to control the state transitions of TAP controller 101, whereas a TCK pin 109 provides clock signals (possibly modified via circuitry 110) to synchronize TAP controller 101, instruction register 103, bypass register 106A, and boundary scan register 106B (all of which are serial shift registers).

The system logic 112 is selectively coupled to a plurality of input/output pins 111. Specifically, either signals from system logic 112 or boundary scan register 106B drive input/output pins 111. This interface between the JTAG architecture and input/output pins 111 is well known in the art and therefore is not described in detail herein.

Figure 2:
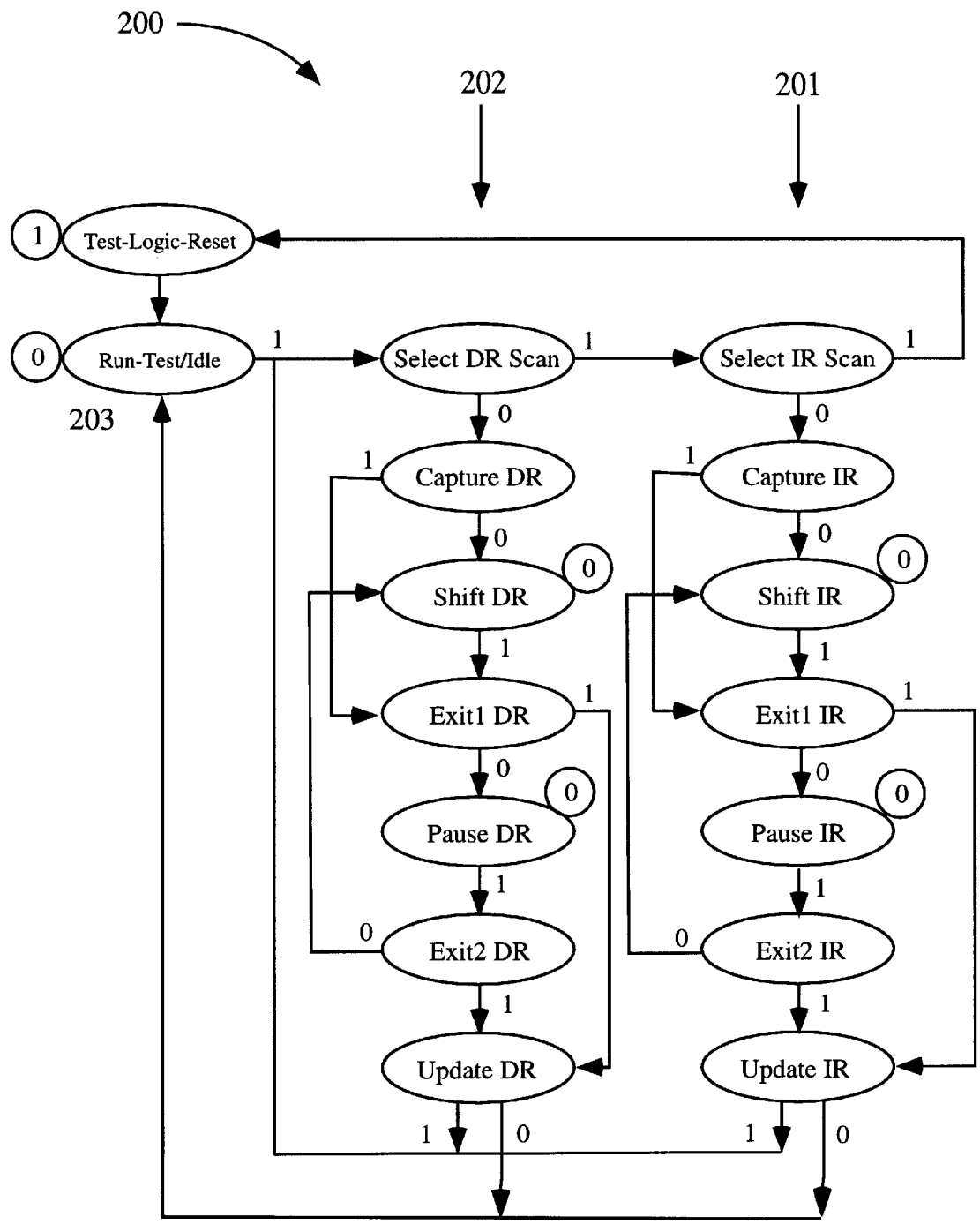
FIG. 2 shows a state diagram of the TAP controller in the present invention.

A state diagram 200 of TAP controller 101, which controls the JTAG architecture of FIG. 1, is shown in FIG. 2. Referring to FIGS. 1 and 2, a first sequence 201 of state transitions, shifts instructions to instruction register 103 and a second sequence 202 of state transitions shifts data to one of the test data registers 106. Note that the Run-Test-Idle state 203 is used to initiate each of the ISP operations of the present invention (described below). State diagram 200, which is described in the IEEE Std. 1149.1 pages 5-1 to 5-16, is well known to those in the art and, therefore, is not explained in detail herein.

Figures 3, 4:
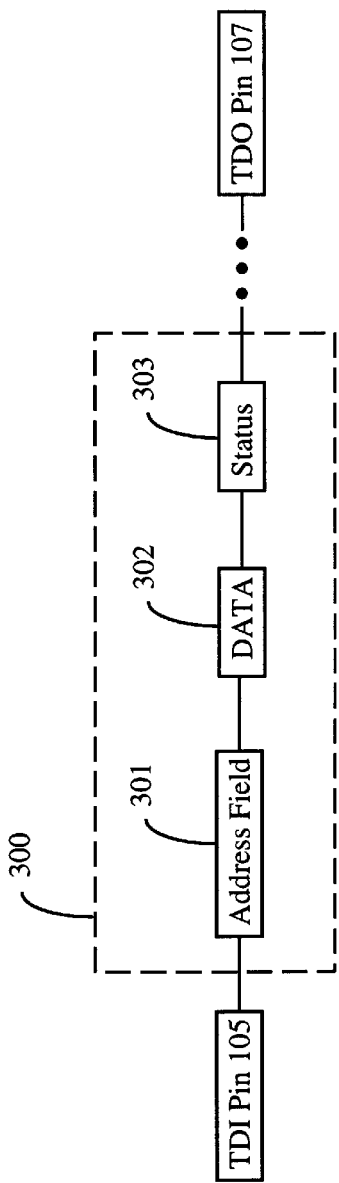
FIG. 3 illustrates the fields of an ISP register of the present invention.
FIG. 4 shows a truth table for the two-bit code used in the status field of the ISP register.
Figure 5:
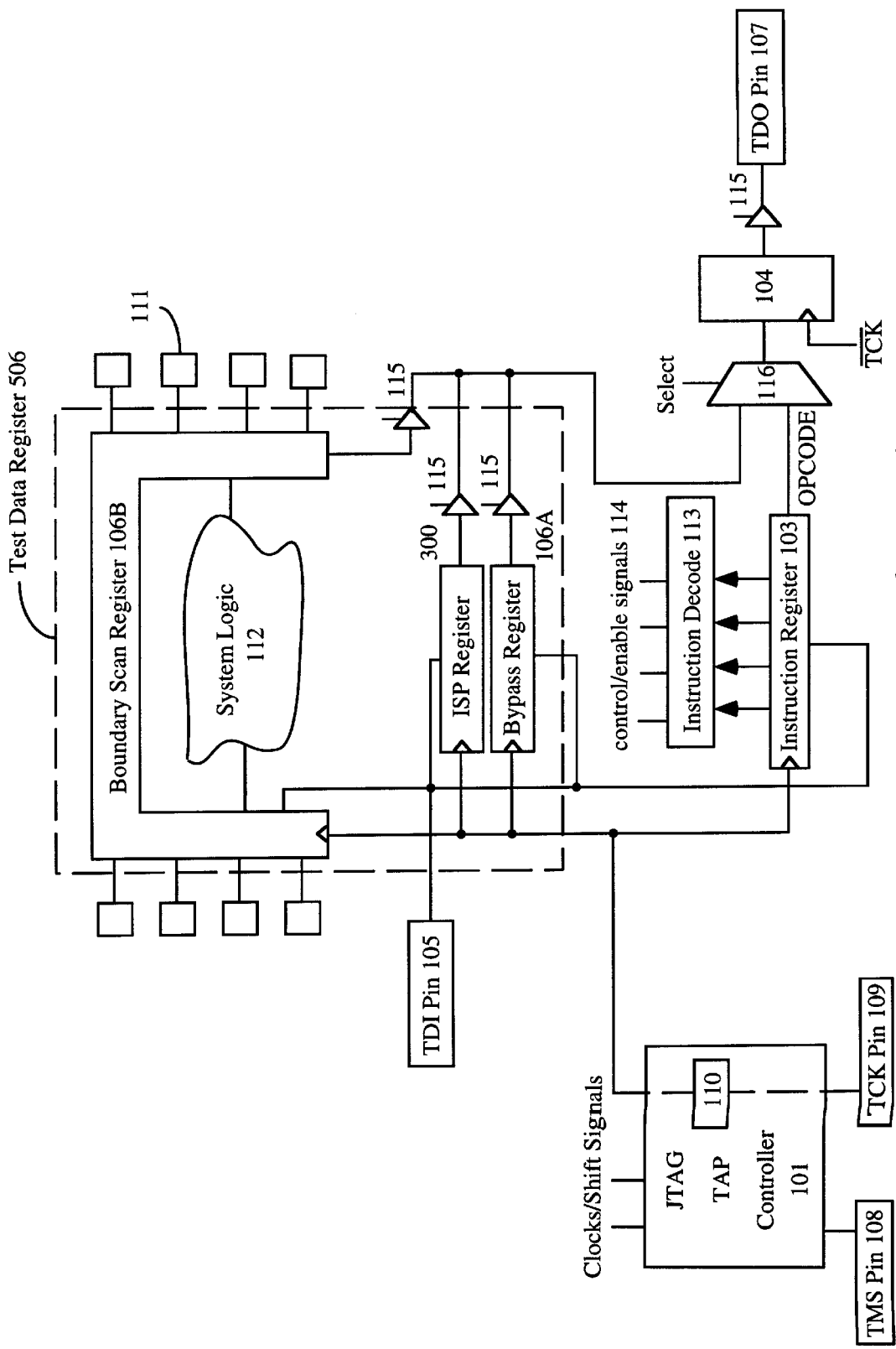
FIG. 5 illustrates an ISP architecture in accordance with one embodiment of the present invention.

In accordance with the present invention, and referring to FIGS. 3 and 5, an ISP register 300, which includes an address field 301, a data field 302, and a status field 303 of an ISP operation, is added to the conventional JTAG architecture. To support ISP operations, three instructions, a function program (FPGM) instruction, a function erase (FERASE) instruction, and a function verify (FVFY) instruction, were added to the JTAG instruction set in the present invention. If any one of those instructions is entered into instruction register 103, then ISP register 300 is selected as the active data register between TDI pin 105 and TDO pin 107. Specifically, instruction decode circuitry 114 decodes the instruction bits in instruction register 113 and provides control/enable signals 114 to tristate buffers 115, for example. Note that multiplexer 116 is controlled by a Select signal provided by TAP controller 101.

In the present invention, status field 303 receives an n-bit code which indicates the corresponding functions shown in FIG. 4. In the embodiment described herein, the n-bit code includes 2 bits. Specifically, a status field input code of "10" indicates that address field 301 and/or data field 302 of ISP register 300 contain a valid address/data packet on which to operate. To prevent accidental programming or erasing of the device, no ISP operation is initiated unless this code is present in status field 303. This "10" code may also be present when contents are shifted out of ISP register 300. In this case, the "10" code indicates that the ISP operation was not allowed for some reason.

Shifting out a status field code of "00" indicates that the current operation has not completed. In contrast, the "01" code indicates that the ISP operation has completed, but that the operation failed, e.g. the data was not successfully programmed. Finally, the "11" code indicates that the ISP operation has successfully completed.

As indicated previously, an FPGM instruction shifted into instruction register 103 selects ISP register 300 as the active data register. To perform a programming operation in the present invention, an address/data packet with a status field code of "10" is shifted into ISP register 300 under control of TAP controller 101. After TAP controller 101 transitions to the Run-Test-Idle state 203 (FIG. 2), controller 101 detects status code "10", thereby triggering a programming pulse for the data stored in data field 302 at the address specified in address field 301. An internal timer (not shown, but well known in the art) ends the programming pulse at the appropriate time if TAP controller 101 remains in Run-Test-Idle state 203. If TAP controller 101 leaves this state prematurely, the programming pulse is terminated as soon as this state is exited.

Irrespective of the cause for termination, when the programming pulse ends, the device automatically performs a verify operation on the address just programmed to verify whether the selected memory cell was successfully programmed. Specifically, additional random logic (not shown but well known in the art) compares the states stored by the currently addressed memory cells to the values in data field 302 of ISP register 300. If those states match the values, thereby indicating that the programming was successful, the random logic indicates that the "11" code is the appropriate value for status field 303. TAP controller 101 then loads that value into ISP register 300. If the programming operation is completed, but the verify operation indicates that programming was not successful, the status field is loaded with "01". Finally, if the value of status field 303 is checked before the entire program/verify operation has completed, status field 303 is loaded with a "00" code.

The present invention provides a number of significant improvements to conventional ISP programming methods. First, only one instruction is required to handle both the programming and the subsequent verification of the data at any addressed location, thereby eliminating the need for a separate verification operation. Second, because only one instruction, the FPGM instruction, is used in this procedure, there is no need to shift in multiple instructions for each address. For example, the FPGM instruction need only be entered once to program the entire device. In this manner, the address/data packets can be shifted back to back into ISP register 300 without inserting multiple instructions between each packet at TDI pin 105, thereby dramatically decreasing the time required to program the entire device in comparison to known ISP methods. Finally, the code in status field 303 provides an end-user an immediate indication of the success or failure of the programming operation.

Figure 8:
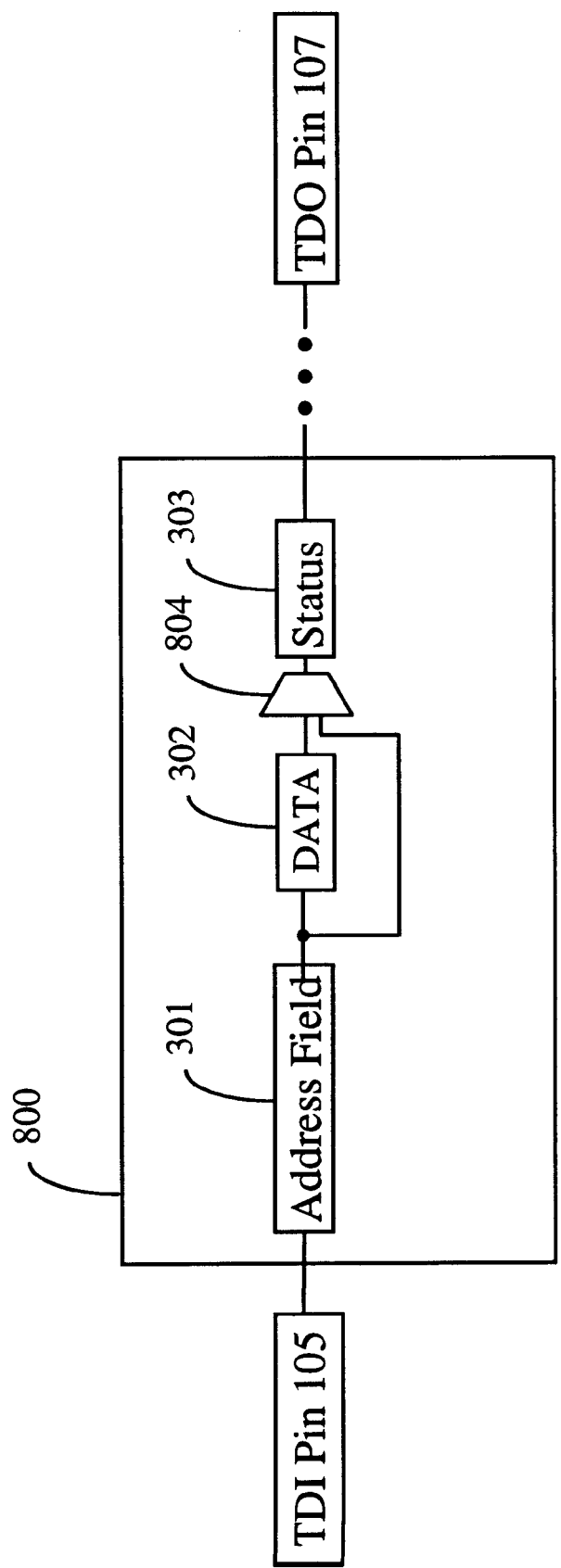
FIG. 8 illustrates the fields of another ISP register of the present invention.

The FERASE instruction, like the FPGM instruction if shifted into instruction register 103, selects ISP register 300 as the active data register. However, the FERASE instruction activates an erase operation that typically operates on a large sector of memory cells (for example, 7920 memory cells) rather than programming only a few cells (in one embodiment, no more than eight memory cells). To perform an erase operation, the address of the sector to be erased is shifted into ISP register 300 with the "10" status code. Note that the bits stored in data field 302 are a "don't care" in this operation. In accordance with another embodiment of the present invention shown in FIG. 8, an ISP register 800 includes a multiplexer 804 between data field 302 and status field 303. In this configuration, data field 302 can be bypassed, thereby eliminating the need to provide bits for that field.

After TAP controller 101 transitions to the Run-Test-Idle state 203, controller 101 detects the "10" status code, thereby triggering the erase pulse for the address of the sector indicated in address field 301. An internal timer (not shown) ends the erase pulse at the appropriate time if TAP controller 101 remains in Run-Test-Idle state 203. If TAP controller 101 leaves this state prematurely, the erase pulse terminates as soon as this state is exited.

Irrespective of the reason for termination, when the erase pulse ends, the device automatically performs a self-blank check operation on the current sector to verify whether the sector was successfully erased by the random logic. The self-blank check is described in detail in U.S. Pat. No. 5,561,631, entitled "HIGH-SPEED MINIMAL LOGIC SELF BLANK CHECKING METHOD FOR PROGRAMMABLE LOGIC DEVICE", which is incorporated by reference herein. If the blank check is successful, thereby also indicating that the erase operation was successful, status field 303 of ISP register 300 is loaded with the "11" code. If the erase operation is completed, but the blank check failed, status field 303 is loaded with the "01" code. Finally, if the value of status field 303 is checked before the entire erase/blank check operation has completed, the field is loaded with a "00" code.

The present invention provides a number of significant improvements to conventional ISP erase methods. First, only one instruction, FERASE, is required to handle both the erase and the subsequent blank check of the given sector, thereby eliminating the need to use the normal verify instruction to individually check each address for erased memory cells. Second, because only one instruction is used in this procedure, there is no need to shift in multiple instructions for each sector. For example, the FERASE instruction need only be entered into instruction register 103 once to erase the entire device. Thus, sector addresses can be shifted back to back into ISP register 300 without inserting multiple instructions between each address at TDI pin 105, thereby dramatically decreasing the time required to erase the entire device in comparison to known ISP methods. Finally, the code of status field 303 immediately indicates the success or failure of the erase operation to the end-user.

The FVFY instruction is used to read back the data at any addressed location in the device when no prior program or erase operation is desired. Once again, the FVFY instruction, like the FPGM and FERASE instructions, if shifted into instruction register 103, selects ISP register 300 as the active data register. For the verify mode, the desired address is shifted into ISP register 300 with a code of "10" in status field 300 (note that the bits stored in data field 302 are a "don't care"). After TAP controller 101 enters the Run-Test-Idle state 203, controller 101 detects this status code, thereby triggering a verify pulse of a specified length. When the verify pulse is terminated, either by the internal timing or by leaving Run-Test-Idle state 203, the state of the memory cell at the addressed location is loaded into data field 302 of ISP register 300. This state may then be shifted out through TDO pin 107 for inspection. The code of status field 303 in this case is "11", thereby indicating that the verify operation has completed. A code of "00" indicates that the status was checked before the operation was done.

An ISP verify method as described above, advantageously eliminates the need to shift in multiple instructions for each address. For example, the FVFY instruction need only be entered once into instruction register 103 to verify the entire chip. In this manner, addresses for the to-be-identified memory cells may be entered back to back into ISP register 300, without inserting multiple instructions between each address at TDI pin 105.

Figure 6:
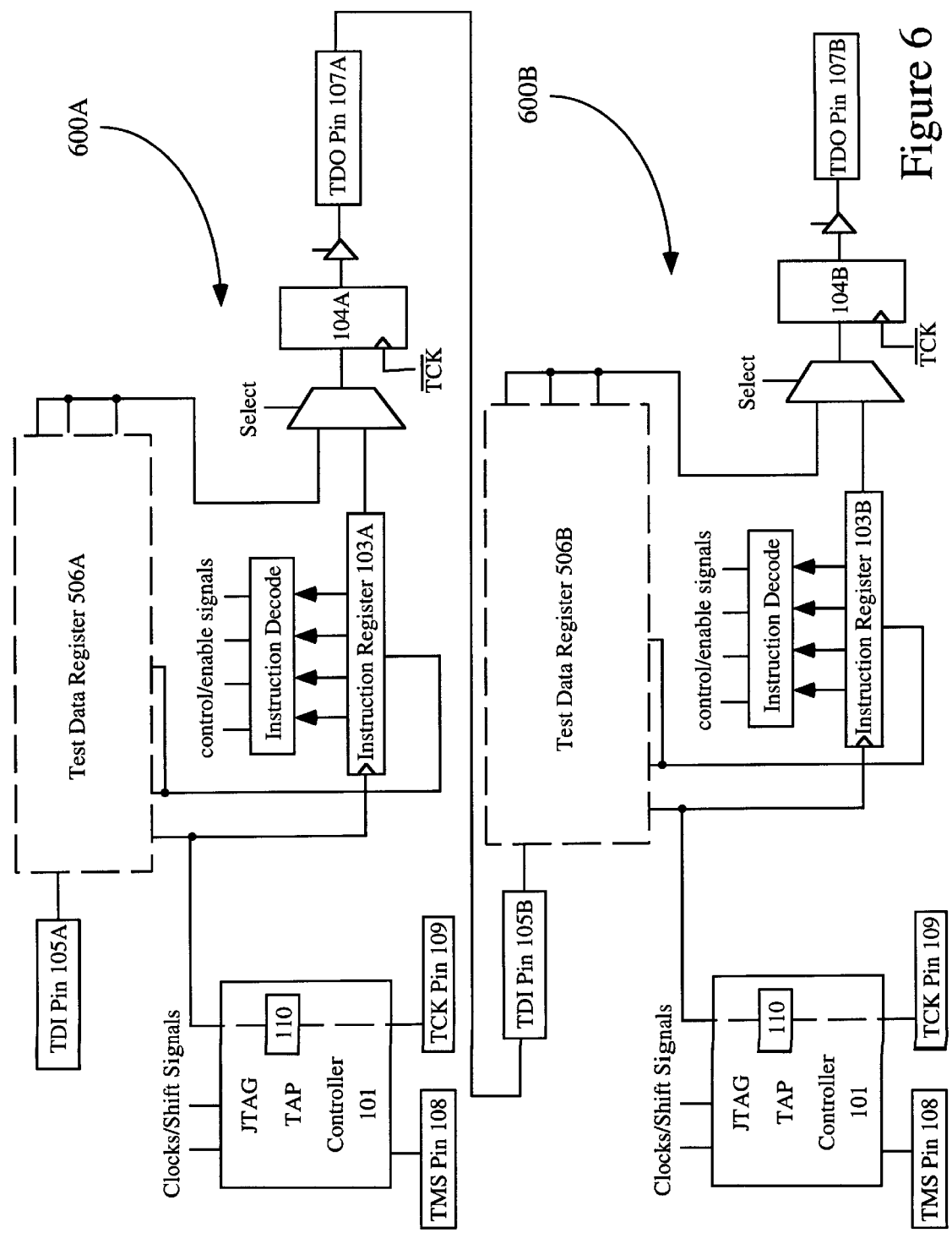
FIG. 6 shows an ISP configuration for multi-chip programming/erasing.

As yet a further advantage and referring to FIG. 6, the present invention facilitates multi-chip programming/erasing by connecting a TDO pin 107A of device 600A to a TDI pin 105B of device 600B, and providing the instruction bits in instruction register 103A to active register 104A (and then to TDO pin 107A). In this configuration, the time of programming/erasing multiple devices is approximately equal to the time of programming one device plus the time for propagating the appropriate signals from TDI pin 105 to TDO pin 107 for each device. Thus, as the chain of devices grows, the time to serially shift in data/instructions also grows. However, the actual operation (i.e. programming, erasing, or verifying) is done in parallel as if only one device were being programmed.

Figure 7:
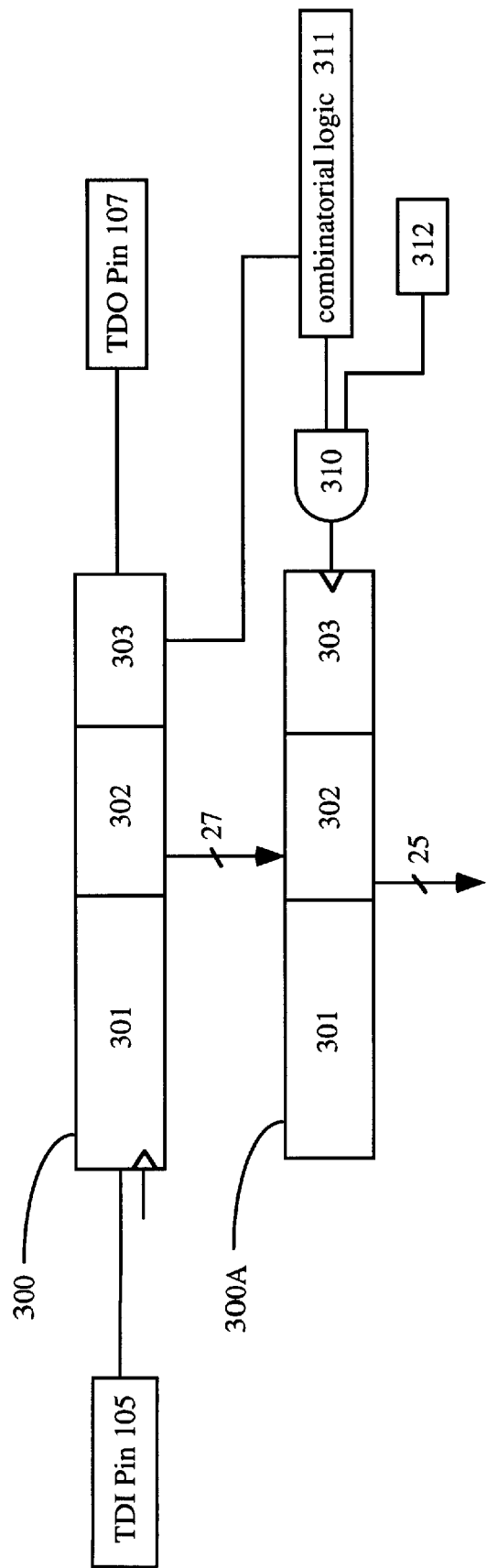
FIG. 7 illustrates another embodiment of the present invention including a shadow ISP register.

In a preferred configuration shown in FIG. 7, a shadow ISP register 300A is coupled to ISP register 300. In this configuration, a status code "01" received by ISP register 300 triggers combinatorial logic 311 to transfer an enabling signal to logic gate 310. In this embodiment, logic gate 310 is an AND gate which receives a logic one enabling signal from combinatorial logic 311 as well as a constant value (also a logic one signal) from memory 312. In this manner, AND gate 310 outputs a high signal to the clock terminal of shadow register 300A, thereby allowing shadow ISP register 300A to capture the bits of ISP register 300 (in this embodiment, 27 bits). Shadow ISP register 300A stores such bits until another status code "01" is received, at which time shadow ISP register 300A stores the updated address/data packet of ISP register 300. In this manner, the present invention ensures that if more than one programming cycle is necessary (for example, if flash EPROM arrays are used) and the code in the status field 303 (FIG. 3) (as verified through TDO pin 107) indicates that programming was unsuccessful, then the address/data packet in shadow register 300A (in this embodiment, 25 bits) is accessed automatically without the need for a separate load cycle.

In this configuration, the present invention also provides that if the results of status field 303 are a "don't care" (for example, if all memory cells receive one programming cycle), the addresses of those cells which did not program are accessed externally (via ISP register 300) and then subjected to an additional programming cycle at a later point in time. As noted previously, shadow ISP register 300A stores the bits from the previous enabling cycle until another status code "01" is received, at which time shadow ISP register 300A stores the updated address/data packet of ISP register 300.

This disclosure is illustrative only and not limiting. Specifically, although the discussion here primarily focuses on the programming of PLD's, the same principles may be applied to any device that makes use of non-volatile memory arrays. Additionally, although the address, data, and status fields are described herein as including specified numbers of bits, other embodiments of the present invention provide for a different number of bits for each field. Furthermore, although the above-described embodiment typically includes memory cell arrays that may be programmed and erased electrically, i.e. EEPROM, Flash EPROM, or Flash EEPROM arrays, the present invention is used in other embodiments including EPROM arrays which must be exposed to ultra-violet light to be erased. Moreover, although the flexibility of the JTAG standard as a general purpose tool for operating on in-system components allows its use to be extended to ISP, the present invention is applicable in any similar architecture. The present invention is set forth in the claims.

We claim:

1. An in-system programming/erasing/verifying structure for non-volatile programmable logic devices including:

a data input pin;

a data output pin;

an instruction register;

a plurality of data registers including an ISP register, wherein said instruction register and said plurality of data registers are coupled in parallel between said data input pin and said data output pin, wherein said ISP register includes an address field, a data field, and an n-bit status field; and a controller for synchronizing the clocking of said instruction register and said plurality of data registers.

2. The structure of claim 1 further including a multiplexer for selectively providing bits from one of said address field and said data field to said n-bit status field.

3. An in-system erasing method for a non-volatile programmable logic device including:

shifting a erase instruction into an instruction register, thereby selecting an ISP register as the active data register;

shifting an address and status code into said ISP register;

initiating an erasing pulse at said address;

terminating said erasing pulse; and automatically performing a verify operation on said address.

4. The in-system erasing method of claim 3 wherein said verify operation determines whether a selected memory cell is erased.

5. The in-system erasing method of claim 4 wherein if said memory cell is erased, then a predetermined status code is loaded into said ISP register.

* * * * *